United States Patent
Parikh et al.

(10) Patent No.: US 7,772,059 B2
(45) Date of Patent: Aug. 10, 2010

(54) METHOD FOR FABRICATING GRAPHENE TRANSISTORS ON A SILICON OR SOI SUBSTRATE

(75) Inventors: Ashesh Parikh, Frisco, TX (US); Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 97 days.

(21) Appl. No.: 12/015,358

(22) Filed: Jan. 16, 2008

(65) Prior Publication Data

US 2009/0181502 A1 Jul. 16, 2009

(51) Int. Cl.
*H01L 21/336* (2006.01)
*H01L 21/8234* (2006.01)

(52) U.S. Cl. .................. 438/198; 438/142; 438/197

(58) Field of Classification Search .............. 257/222, 257/477, 76, 77, 797; 438/163, 149, 151, 438/164, 183, 194, 405, 689, 198; 428/408, 428/688; 117/97
See application file for complete search history.

(56) References Cited

U.S. PATENT DOCUMENTS

| | | | | |
|---|---|---|---|---|
| 3,960,619 A | * | 6/1976 | Seiter | 117/97 |
| 4,843,448 A | * | 6/1989 | Garcia et al. | 257/477 |
| 5,726,081 A | * | 3/1998 | Lin et al. | 438/163 |
| 6,221,732 B1 | * | 4/2001 | Kaneko | 438/405 |
| 6,673,694 B2 | | 1/2004 | Borenstein | |
| 6,821,911 B1 | | 11/2004 | Lo et al. | |
| 7,015,142 B2 | | 3/2006 | DeHeer et al. | |
| 2003/0211724 A1 | | 11/2003 | Haase | |
| 2006/0099750 A1 | * | 5/2006 | DeHeer et al. | 438/194 |
| 2006/0267100 A1 | * | 11/2006 | Noguchi et al. | 257/351 |
| 2007/0160842 A1 | * | 7/2007 | Hirata et al. | 428/408 |
| 2009/0020764 A1 | * | 1/2009 | Anderson et al. | 257/77 |

OTHER PUBLICATIONS

"Structural characterization of 3C-SiC films grown on Si layers wafer bonded to polycrystalline SiC substrates", R.L. Myers, K.D. Hobart, M. Twigg, S. Rao, M. Fatermi, F.J. Kub and S.E. Saddow, Mat. Res. Soc. Symp. Proc, vol. 815, 2004 Materials Research Society, pp. J5.23.1-J5.23.4.

* cited by examiner

*Primary Examiner*—Thanh V Pham
*Assistant Examiner*—Errol Fernandes
(74) *Attorney, Agent, or Firm*—Jacqueline J. Garner; Wade J. Brady, III; Frederick J. Telecky, Jr.

(57) ABSTRACT

A method of fabricating graphene transistors, comprising providing an SOI substrate, performing an optional threshold implant on the SOI substrate, forming an upper silicon layer mesa island, carbonizing the silicon layer into SiC utilizing a gaseous source, converting the SiC into graphene, forming source/drain regions on opposite longitudinal ends of the graphene, forming gate oxide between the source/drain regions on the graphene, forming gate material over the gate oxide, creating a transistor edge, depositing dielectric onto the transistor edge and performing back end processing.

12 Claims, 4 Drawing Sheets

METHOD FOR FABRICATING GRAPHENE TRANSISTORS ON A SILICON OR SOI SUBSTRATE

FIELD OF INVENTION

The present invention relates generally to semiconductor processing, and more particularly to methods for constructing semiconductor graphene transistors on silicon, SOI or other composite silicon substrates.

BACKGROUND OF THE INVENTION

Several trends presently exist in the semiconductor and electronics industry. Devices are continually being made smaller, faster and requiring less power. One reason for these trends is that personal devices are being fabricated that are smaller and more portable, thereby relying on batteries as their primary supply. For example, cellular phones, personal computing devices, and personal sound systems are devices that are in great demand in the consumer market. In addition to being smaller and more portable, personal devices are also requiring increased memory, more computational power and speed. In light of these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve higher densities, there has been and continues to be efforts toward scaling down dimensions (e.g., at submicron levels) on semiconductor wafers generally produced from bulk silicon. These trends are pushing the current technology to its limits. In order to accomplish these trends, high densities, smaller feature sizes, smaller separations between features, and more precise feature shapes are required in integrated circuits (ICs). This may include the width and spacing of interconnecting lines, spacing and diameter of contact holes, as well as the surface geometry of various other features (e.g., corners and edges).

It can be appreciated that significant resources go into scaling down device dimensions and increasing packing densities. For example, significant man hours may be required to design such scaled down transistor devices, the equipment necessary to produce such devices may be expensive and/or processes related to producing such devices may have to be very tightly controlled and/or be operated under very specific conditions, etc. Accordingly, it can be appreciated that there is significant costs associated with exercising quality control over semiconductor fabrication, including, costs associated with discarding defective units, wasting raw materials and/or man hours, for example. Additionally, since the units are more tightly packed on the wafer, more units are lost when some or all of a wafer is defective and thus has to be discarded. The semiconductor industry is pursuing graphene to achieve some of the aforementioned goals with reduced defects. However, semiconductor devices utilizing graphene are currently difficult to construct.

Therefore, it would be advantageous to fabricate semiconductors utilizing graphene efficiently on existing wafers/ workpieces that are currently utilized in transistor devices, for example, single crystal silicon wafers, SOI wafers, etc.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

According to at least one aspect of the present invention is a method of fabricating graphene transistors, comprising providing an SOI substrate, performing an optional threshold implant on the SOI substrate, forming an upper silicon layer mesa island, carbonizing the silicon layer into SiC utilizing a gaseous source, converting the SiC into graphene, forming source/drain regions on opposite longitudinal ends of the graphene, forming gate oxide between the source/drain regions on the graphene, forming gate material over the gate oxide, creating a transistor edge, depositing dielectric onto the transistor edge and performing back end processing.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
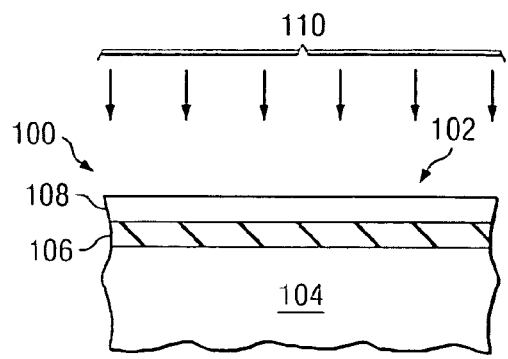
FIGS. 1 and 2 are a cross-sectional side view and a top view of an SOI substrate, respectively, according to one aspect of the present invention.
Figure 2:
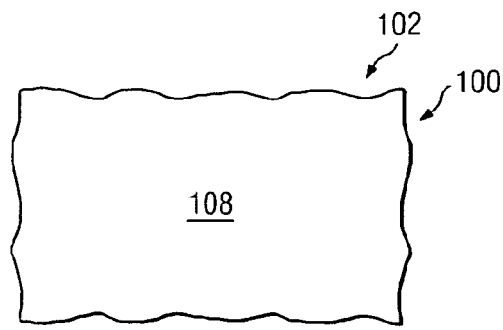

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding. It may be evident, however, to one skilled in the art, that one or more aspects described herein may be practiced with a lesser degree of these specific details. In other instances, known structures and devices are shown in block diagram form to facilitate a thorough understanding.

According to at least one embodiment of the present invention, a standard workpiece/wafer can be utilized that comprises a silicon-on-insulator (SOI) substrate. However a single crystal silicon substrate, a Poly-Si, or other substrate composites can be utilized as well. Such substrates are commercially obtainable and are fabricated using various techniques that are well-known in the art. Wafers can also be obtained from a large number of suppliers of standard semiconductor material, specific dimensions, consistent crystallographic orientation, etc. Once the workpiece parameters have been selected and the material obtained, processing of the transistor begins.

The device and methods for forming the device will be described with reference to FIGS. 1-21 describing the device and FIG. 22 that illustrates the method of fabricating the device. There are numerous known methods for forming the various layers of a transistor device 100. FIG. 1 illustrates one embodiment of the present invention, the transistor device 100 in its initial stage of formation, which utilizes a silicon-on-insulator substrate 102 at 2202 (FIG. 22). The silicon-on-insulator substrate 102 comprises e.g., a buried oxide film layer 106 in the range of 200 nm to 400 nm formed on a silicon substrate 104 using, for example, by oxygen ion implantation. The buried oxide film 104 acts as an insulator and a single crystal silicon film 108 is formed on the oxide film layer 106. The single crystal silicon film 108 can be bonded to the oxide film layer 106. In addition, a layer of silicon can be formed on the oxide film layer 106 by any appropriate method such as a thermal chemical vapor deposition (CVD) method, an electron cyclotron resonance (ECR) method, an LPCVD method or a plasma CVD method, all of which methods are well-known and skill in the art. The techniques of forming SOI substrates are well known skill in the art.

The device layer parameters are essential in the design of the transistor device 100, as the parameters will translate directly into the properties of the resulting nano-technology transistor structure. Electrical resistivity, chemical content, growth technique, crystalline orientation and other wafer parameters are selected based on the properties required of the end device 100.

An optio-screening oxide layer (not shown) can be deposited to a thickness of approximately 35 nm, for example. A threshold adjustment implant 110 can then be utilized at 2204 (FIG. 22), wherein after the implantation the screen oxide layer or patterned photoresist (not shown) can be removed. Photolithographic techniques are well known by those of skill in the art.

Figure 3:
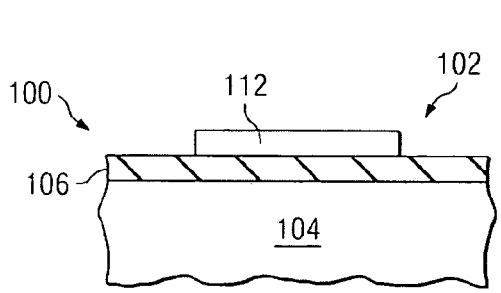
FIGS. 3 and 4 are a cross-sectional view and a top view of a mesa island formed in the SOI substrate, according to another aspect of the present invention.
Figure 4:
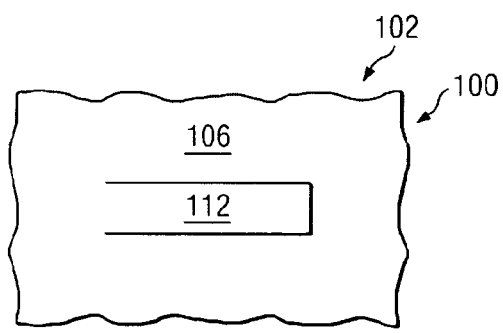

As illustrated at 2206 (FIG. 22) and in FIGS. 3 and 4, a mesa patterning photoresist (not shown) can be deposited, patterned and etched, utilizing typical well known photolithographic processes to form a silicon mesa island 112 on the oxide film layer 106 as shown. The single crystal silicon film 108 can be patterned using standard lithographic methods and wet chemical mesa etching in a mixture of HF and $H_2NO_3$. Alternatively, the mesa etch may be performed using potassium hydroxide (KOH) or other crystallographic etchants, which produce approximately 90 degree sidewalls as illustrated in FIGS. 3 and 4.

Figure 5:
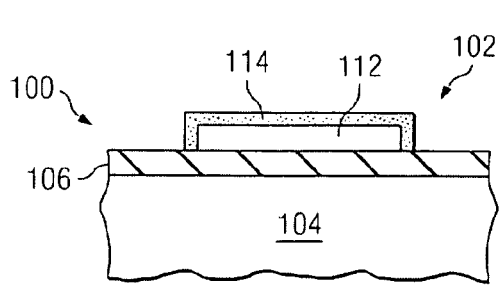
FIGS. 5 and 6 are a cross-sectional side view and a top view of carbonization of the silicon mesa island, according to yet another aspect of the present invention.
Figure 6:
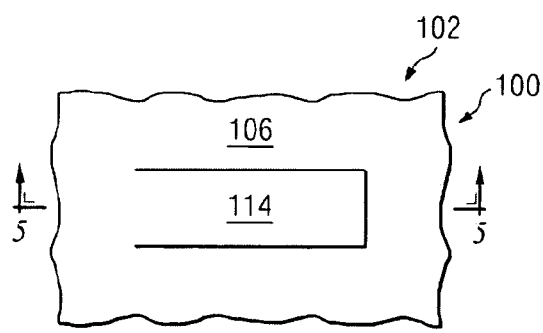

Following the formation of the silicon mesa island 112, a deposition or carbonization of silicon into hexagonal silicon carbide (SiC) 114 is performed at 2208 (FIG. 22). The device is illustrated in FIG. 5, as a cross-sectional view and FIG. 6, as a top view of the device 100, using a gaseous source, such as described in Seiter (U.S. Pat. No. 3,960,619), Brander (U.S. Pat. No. 3,527,626) or Myers et al. (Materials Research Society, Symposium, Vol. 815 2004). Alternatively, SiC 114 could be deposited on the $SiO_2$ wafer using wafer bonding techniques and patterns described by Vinod et al. (Journal of Electronic Materials, March 1998). The Seiter, Brander and Myers et al. references are incorporated herein in their entirety.

The Seiter reference discloses a low temperature process for preparing an epitaxial layer of hexagonal silicon carbide 114 on a substrate of a monocrystal of silicon. In one embodiment of the present invention the silicon carbide layer can be made epitaxially of the hexagonal modification at low temperatures, for example, temperatures below 1400° C., (the melting point of silicon is approximately 1420° C.) whereby the silicon becomes a useful substrate in this process.

This embodiment can be realized according to the present invention wherein an epitaxial layer is formed of hexagonal silicon carbide layer 114 on the silicon mesa island 112. This is done by simultaneous reduction and thermal decomposition of a gaseous mixture of silicon halides and/or organosilanes, hydrocarbons and hydrogen, on the silicon mesa island 112, characterized thereby that the gaseous mixture contains water or a compound releasing water at the temperature of operation.

As is known by those of skill in the art, and disclosed in Seiter, the formation of the hexagonal silicon carbide (SiC) 114 can be carried out in a reactor known for silicon epitaxial layer formation, wherein such reactors are widely available commercially. The reactor can consist of a quartz vessel with a graphite body therein, onto which the silicon substrates are deposited. The graphite body may be heated up to the desired temperature by means of a high frequency coil surrounding a quartz vessel. The temperature can range from 1100 C to 1400 C, preferably from 1200 C to 1300 C; and can be measured pyrometrically. Using a silicon substrate having a Miller indice (111) or (110) for carbonization 114 may be advantageous. An optional pretreatment on the surface of the mesa island 112 can be carried out prior to the silicon carbide deposition 114, e.g. by tempering the island 112 at 1200 C or by etching with a gas, e.g. HCl, or water. After the pretreatment, the gaseous mixture is passed over the substrate at the deposition temperature either in premixed form or in the form of the several individual components. It is to be appreciated that a portion of the silicon can be converted into SiC.

As disclosed in Seiter, the main component of the gas mixture is hydrogen, which acts as a carrier gas and a reducing agent. The silicon halide or organosilanes are present in the amounts of 0.1 to 5% by volume. The mixture further contains 0.1 to 5% by volume hydrocarbons. Water or water-releasing compounds are added in amount of 0.01 to 1% by volume.

Silicon halides can be utilized, e.g. silicon bromides or silicon iodides, preferably silicon chlorides such as $SiCl_4$, $SiHCl_3$ and $SiH_2Cl_2$ or mixtures of the same are utilized. The organosilanes used are preferably alkylsilanes, e.g. $SiR_4$, $SiR_3Cl$, $SiR_2Cl_2$ and $SiRCl_3$, or mixtures thereof, R standing for alkyl radicals with 1 to 4 C atoms or hydrogen. Examples for hydrocarbons are aliphatic hydrocarbons, particularly alkanes and alkenes with 1-8 C atoms, such as methane, ethane, ethylene, propane, propylene, butane or mixtures thereof.

Water-forming compounds can comprise oxygen containing carbon compounds, e.g. alcohols, aldehydes, carboxylic acids, preferably $CO_2$, as well as oxygen-containing nitrogen compounds, e.g. nitrogen oxides, for instance $N_2O$, NO or $N_2$. Mixtures of those compounds may be used, as well.

The existence of water in the reactor counteracts the deposition of elementary carbon and/or elementary silicon. This results in the formation of pure silicon carbide without the admixture of silicon or carbon. This also helps to avoid the formation of undesirable nuclei of silicon carbide on $SiO_2$ layers, which are used as protective covering in a selective deposition of silicon carbide. If such a selective, local deposition of silicon carbide is desired, a perforated sheet of $SiO_2$, e.g. 1000 nm thick, can be made on the silicon substrate in accordance with methods used and well known by those of skill in the art.

The inventors recognized that the current technology utilizes a catalyst on the source side, for example, to facilitate growth of the graphene to the drain side. The inventors recognized that by eliminating the expensive catalyst or seed layer, they not only reduced the cost of the formation process but they also increased reliability and utilized existing standard fabrication process techniques. The inventors also recognized that by modulating the island height/width allows for tuning of graphene properties. There is also a cost reduction achieved by removing enabling technology away from litho/etch techniques to modulation of material properties. The size of the graphene layer defined by lithography/etching can allow for better control. The fabrication is easily applicable to existing silicon substrates or SOI or other substrate types.

Figure 7A:
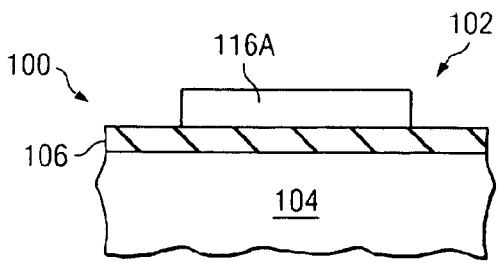
FIGS. 7A, 7B, 8A and 8B illustrate a cross-sectional side views and top views graphene formed on top of a portion of the SOI substrate, according to yet another aspect of the present invention.
Figure 7B:
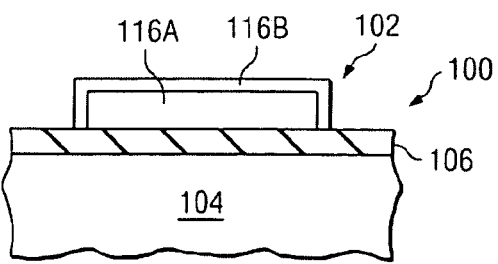
Figure 8A:
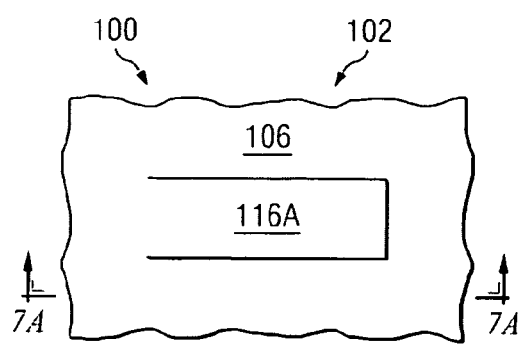
Figure 8B:
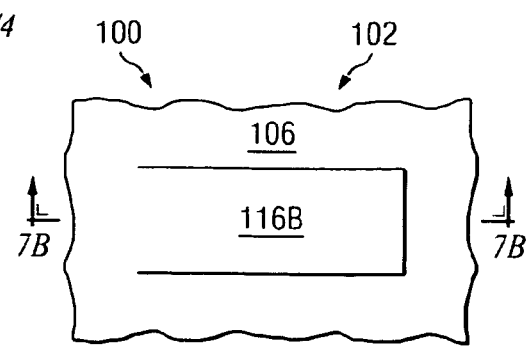

FIGS. 7A, 7B, 8A and 8B illustrate the formation of graphene 116B on the silicon carbide graphene 116A at 2210 (FIG. 22) as described in "Morphology of Graphene Thin Film Growth on SiC (0001)" by Ohta et al. The Ohta et al. reference is incorporated herein in its entirety. FIG. 7A is a cross-sectional side view of the cross-section shown in FIG. 8A. A graphitic layer or film can be grown on the hexagonal silicon carbide (SiC) 116A on top of the crystal silicon film 116A, as shown in FIG. 7B. The single crystal silicon film 108 can be annealed at approximately 1000 C to 1600 C for about 1 to 20 minutes at a vacuum (e.g., $10^{-6}$ to $10^{-9}$ Torr). In another illustrative embodiment, the annealing can include electron beam heating of the transistor device 100 at a pressure of approximately $10^{-6}$ to $10^{-10}$ Torr for about 1 minute to 20 minutes. The graphene layer 116B implies only a single layer of carbon atoms, or a graphite layer, which implies a plurality of graphene layers. While a minimal number of grapheme layers are preferred in some applications, tens or hundreds of graphene layers may be formed without departing from the scope of the invention. It should be readily apparent that one or more of the processes employed will take place in some kind of vessel or chamber, of a type that would be readily appreciable by those of skill in the semiconductor and chemical arts.

The ultra-thin graphite film (UTGF) on the hexagonal silicon carbide (SiC) is related to that of graphene of similar dimensions, and it has properties that are similar to those of carbon nanotubes. For example, a narrow graphene strip (with a width from 1 to 100 nm) is a one dimensional conductor and either metallic or semi-conducting depending on its structure and the band gap for a semi-conducting graphene strip is inversely proportional to its width. It is expected that narrow graphene strips will be room temperature ballistic conductors on size scales of at least 100 nm. It is to be appreciated that the properties of the graphene strips can be modulated by varying the dimensions of the graphene layers/strips, as is well known by those of skill in the art.

Figure 9:
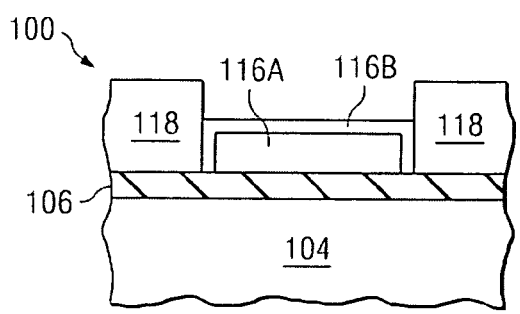
FIGS. 9, 10, 11 and 12 are cross-sectional views; and top views of source/drains formed on a portion of SOI substrate, according to at least one aspect of the present invention.
Figure 10:
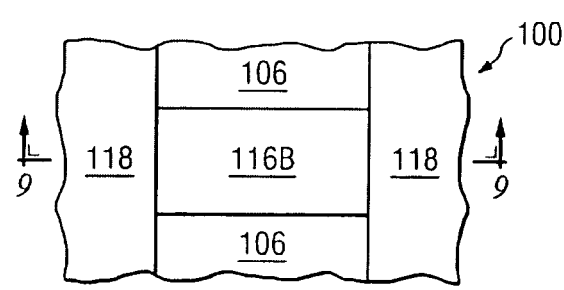
Figure 11:
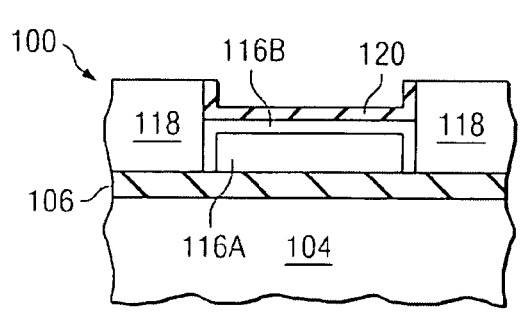

As illustrated in FIGS. 9 and 10, source-drain material 118 is patterned utilizing photolithographic techniques on the oxide film layer 106 of the partial transistor device 100 at 2212 (FIG. 22) using conventional photolithographic techniques. FIG. 9 is a cross-sectional side view of the top view illustrated in FIG. 10 based upon the cross-sectional view, as shown. The source/drain material deposition is followed by an ion implantation. The configuration of the photolithographic mask (not shown) used to generate the photoresist pattern can vary depending upon the desired outline or shape of the desired source/drains 118 which are formed on the oxide film layer 106 and against the graphene 116. The graphene 116 acts as a channel between the source/drains 118.

In one embodiment of the present invention the source/drain areas 118 are formed by the ion implantation with ions comprising materials such as phosphorus, titanium nitride or arsenic. The photoresist (no shown) covering the graphene region prevents implantation in that area. The source and drain contact regions 118 can be lightly to heavily doped based upon the function of the transistor device 100. The photoresist is deposited and patterned on the transistor device 100 using conventional photolithographic techniques that are well known by those of skill in the art.

Figure 12:
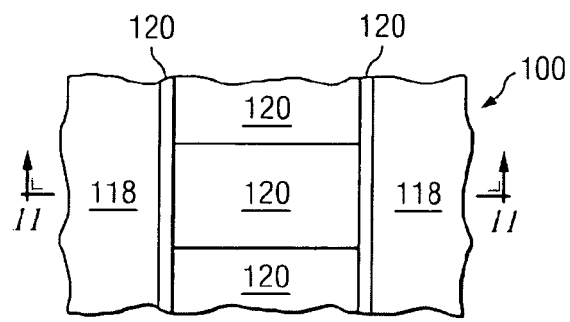
Figure 13:
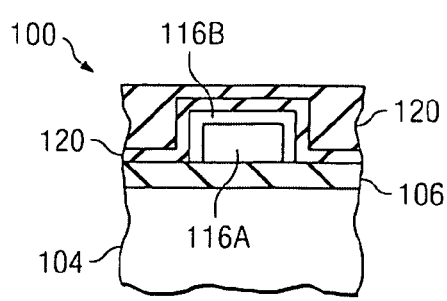
FIGS. 13 and 14 are a cross-sectional view and a top view of gate oxide formation, according to another aspect of the present invention.
Figure 14:
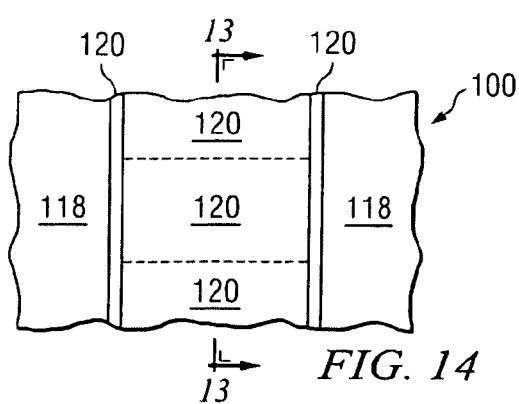

A gate oxide 120 is deposited as illustrated in FIGS. 11, 12, 13 and 14. FIG. 12 illustrates a top view of the device with a cross sectional view shown in FIG. 11. FIG. 13 illustrates the top view of the device shown in FIG. 12 with a cross sectional view, shown in FIG. 11. A photoresist (not shown) is deposited, patterned and etched to protect the top surface of the source/drain regions 118. The oxide for example can comprise a high-k material such as $HfO_2$. The gate oxide 120 is formed over the top of the graphene 116, the exposed oxide film layer 106 and the sidewalls of the source/drains 118 as illustrated. The formation of gate oxide layers is well known by those of skill in the art.

Figure 15:
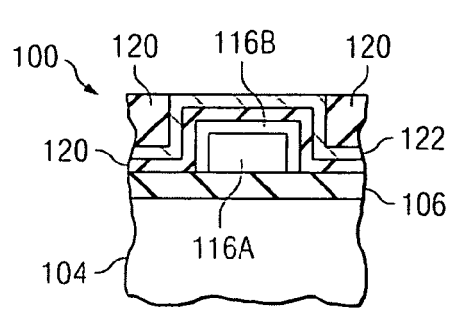
FIGS. 15 and 16 are a cross-sectional view and a top view of gate formation, according to yet another aspect or aspects of the present invention.
Figure 16:
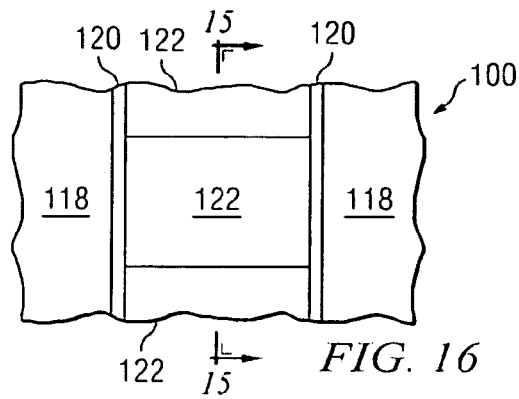
Figure 17:
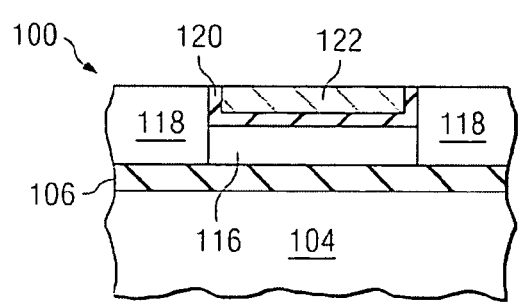
FIGS. 17, 18, 19 and 20 are cross-sectional views; and top views of gates formed on a portion of SOI substrate, according to at least one aspect of the present invention.
Figure 18:
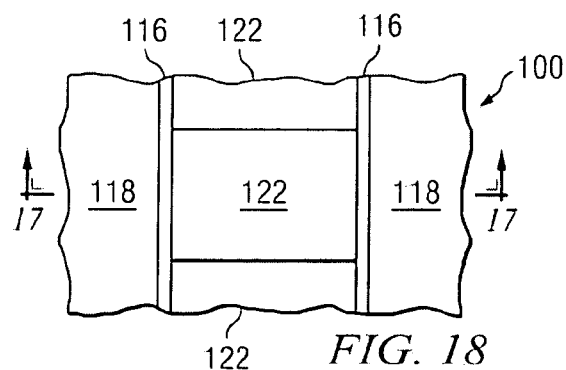
Figure 19:
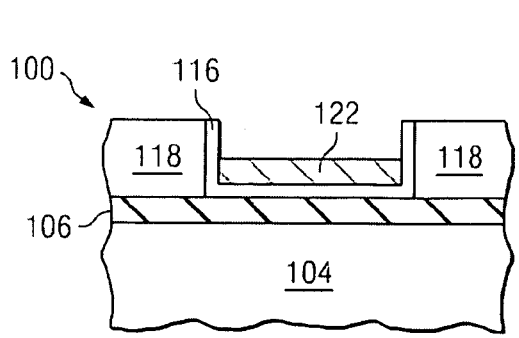
Figure 20:
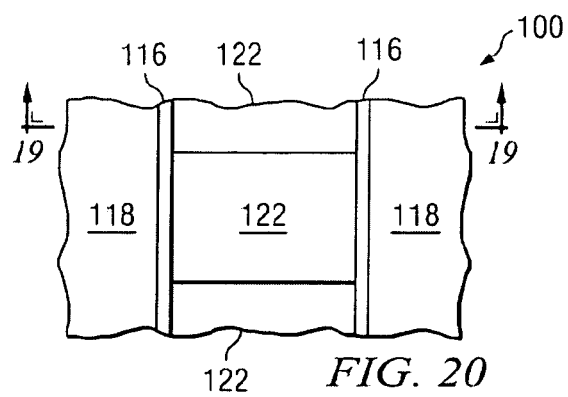

FIG. 15 is a cross-sectional side view of the top view illustrated in FIG. 16, wherein FIGS. 17 and 18 are a cross sectional side view and top view of the same device. At 2214, the graphene 116 act as a channel separated from the gate 122 by the gate oxide 120. It should be apparent to one of skill in the art that the gate oxide 120 can comprise multiple layers, e.g., an ONO layer. The gate 122 is also separated from the source/drain regions 118 by the gate oxide 120, whereas the source/drain regions 118 can be in direct contact with the graphene 116. FIG. 19 is cross-sectional view taken through the top view of the device illustrated in FIG. 20 which is the same as FIGS. 16 and 18.

Figure 21:
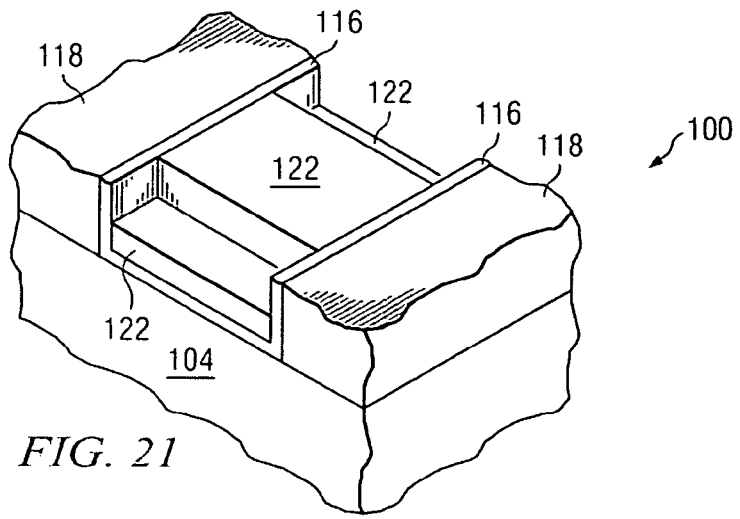
FIG. 21 is a perspective view of the transistor device, according to yet another aspect of the present invention.
Figure 22:
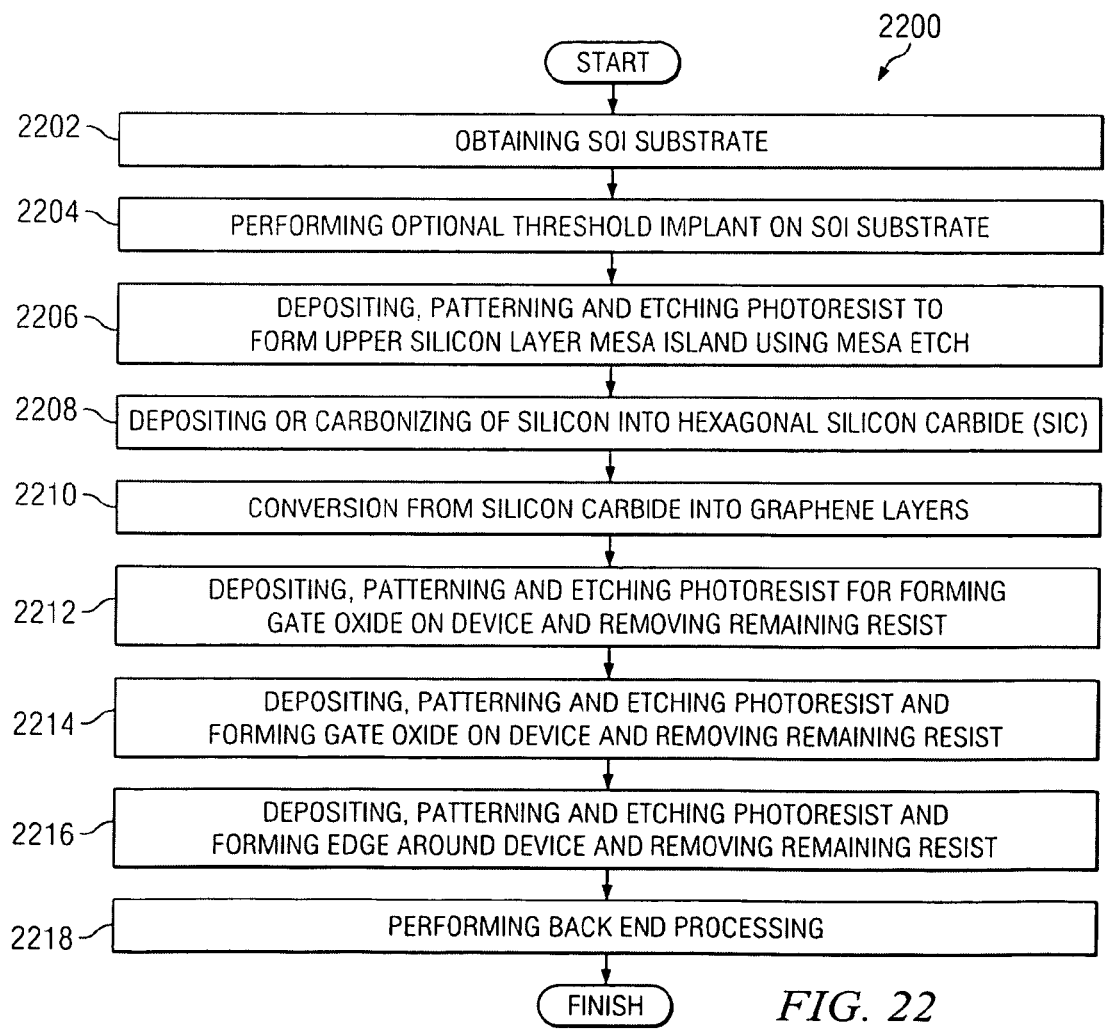
FIG. 22 illustrates a fabrication flow chart diagram according to at least one aspect of the present invention.

FIG. 21 is a perspective view of the transistor device 100 illustrated in FIGS. 15-20. At 2216, an edge (not shown for clarity) can be formed around the outside surface of the device 100. A photoresist (not shown) can be deposited, patterned and etched so that the edge can be formed around the device 100. The inventors recognized the value of the process being repeatable wherein "stacked" transistors can be formed in this way resulting in cost reduction and density improvement.

At 2218, back end processing (BEOL) can be performed, comprising creating and filling trenches, creating vias, fabricating copper interconnect wiring, encapsulating the devices for electrical isolation and packaging, making electrical contact through contact vias and trenches to capacitors and metal resistors, and the like. BEOL processing is well known by those of skill in the art.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method of fabricating a transistor device, comprising the steps of:
   providing a substrate
   forming an upper silicon layer mesa island at a surface of the substrate:
   forming graphene layers by first carbonizing the silicon layer into SiC utilizing a gaseous source and then converting the SiC into graphene layers;
   after forming the graphene layers, forming source/drain regions by depositing source/drain material on opposite longitudinal ends of the graphene layers and ion implanting the source/drain material;
   forming gate oxide between the source/drain regions on the graphene layers; and
   forming gate material over the gate oxide.

2. The method of claim 1, wherein the substrate is a SOI substrate.

3. The method of claim 2 further comprising the step of performing a threshold implant on the SOI substrate.

4. A method for semiconductor processing, comprising the steps of:
   (a) providing an SOI substrate
   (b) performing a threshold implant on the SOI substrate
   (c) forming an upper silicon layer mesa island at a surface of the SOI substrate:
   (d) forming graphene layers by first carbonizing the silicon layer into SiC utilizing a gaseous source and then converting the SiC into said graphene layers;
   (e) after forming the graphene layers, forming source/drain regions by depositing source/drain material on opposite longitudinal ends of the graphene layers and ion implanting the source/drain material;
   (f) forming gate oxide between the source/drain regions on the graphene; and
   (g) forming gate material over the gate oxide;
   (h) creating a transistor edge;
   (i) depositing dielectric onto the transistor edge;
   repeating (a) through (i) a predetermined number of times; and
   performing back end processing.

5. The method of claim 4, wherein the process of forming the mesa island comprises:
   depositing, patterning and etching mesa forming photoresist;
   forming the upper silicon layer mesa island using a mesa etch; and
   removing the mesa forming photoresist.

6. The method of claim 4, wherein the threshold implant on the SOI substrate comprises:
   depositing, patterning and etching threshold implant photoresist;
   performing the optional threshold implant; and
   removing the threshold implant photoresist.

7. The method of claim 4, wherein the carbonizing silicon layer into SiC utilizing a gaseous source comprises:
   placing the SOI substrate in a reactor consisting of a quartz vessel and a graphite body therein;
   heating the graphite body to a specified temperature; and
   passing a gaseous mixture over the SOI substrate.

8. The method of claim 4, wherein the gaseous mixture comprises:
   0.1 to 5% by volume hydrocarbons;
   0.01 to 1% by volume water or water-releasing compounds;
   0.1 to 5% by volume silicon halides or organosilanes; and hydrogen.

9. The method of claim 8, wherein the hydrocarbons comprise:
   aliphatic hydrocarbons, alkanes and alkenes with 1-8 C atoms, methane, ethane, ethylene, propane, propylene, butane and mixtures thereof.

10. The method of claim 8, wherein the silicon halides comprise:
    silicon bromides, silicon iodides, $SiCl_4$, $SiHCl_3$ and $SiH_2Cl_2$ and mixtures thereof.

11. The method of claim 8, wherein the organosilanes comprise:
    alkylsilanes, $SiR_4$, $SiR_3Cl$, $SiR_2Cl_2$ and $SiRCl_3$ and mixtures thereof, wherein R represents alkyl radicals with 1 to 4 C atoms or hydrogen.

12. The method of claim 8, wherein the water-forming compounds comprise:
    oxygen containing carbon compounds, alcohols, aldehydes, carboxylic acids, $CO_2$, oxygen-containing nitrogen compounds, nitrogen oxides, $N_2O$, NO and mixtures thereof.

* * * * *